United States Patent
Bloebaum et al.

(10) Patent No.: US 7,299,024 B2
(45) Date of Patent: Nov. 20, 2007

(54) COMPENSATION FOR FREQUENCY ADJUSTMENT IN MOBILE COMMUNICATION-POSITIONING DEVICE WITH SHARED OSCILLATOR

(75) Inventors: L. Scott Bloebaum, Cary, NC (US); Piyush Bharti, London (GB); Sherk Chung, San Bruno, CA (US); Benjamin Van Roy, San Mateo, CA (US); Wallace Mann, Mill Valley, CA (US)

(73) Assignee: SiRF Technology, Inc., San Jose, CA (US)

( * ) Notice: Subject to any disclaimer, the term of this patent is extended or adjusted under 35 U.S.C. 154(b) by 274 days.

(21) Appl. No.: 10/718,821

(22) Filed: Nov. 21, 2003

(65) Prior Publication Data

US 2004/0102165 A1    May 27, 2004

Related U.S. Application Data

(62) Division of application No. 10/126,449, filed on Apr. 19, 2002, now Pat. No. 6,724,342.

(51) Int. Cl.
*H04B 1/06* (2006.01)

(52) U.S. Cl. ............... 455/258; 455/556.1; 342/357.12

(58) Field of Classification Search ........ 455/255–260, 455/208, 556.1; 342/357.1, 357.12
See application file for complete search history.

(56) References Cited

U.S. PATENT DOCUMENTS

| | | | |
|---|---|---|---|
| 5,542,114 A * | 7/1996 | Kojima et al. ........... 455/196.1 |
| 5,663,735 A | 9/1997 | Eshenbach | |
| 5,950,120 A | 9/1999 | Gardner et al. | |
| 5,970,400 A * | 10/1999 | Dwyer ....................... 455/254 |
| 6,041,222 A | 3/2000 | Horton et al. | |
| 6,150,980 A | 11/2000 | Krasner | |
| 6,211,820 B1 | 4/2001 | Zou et al. | |
| 6,433,734 B1 * | 8/2002 | Krasner ................. 342/357.09 |
| 6,738,608 B2 * | 5/2004 | Black et al. ............... 455/260 |
| 6,925,292 B2 * | 8/2005 | Syrjarinne et al. ......... 455/255 |

FOREIGN PATENT DOCUMENTS

| | | |
|---|---|---|
| EP | 1 130 415 A2 | 9/2001 |
| WO | WO 99/57929 | 11/1999 |
| WO | WO 00/21223 | 4/2000 |
| WO | WO 02/09310 | 1/2002 |

* cited by examiner

*Primary Examiner*—Edward F. Urban
*Assistant Examiner*—Adeel Haroon
(74) *Attorney, Agent, or Firm*—Jonathan W. Hallman; MacPherson Kwok Chen & Heid LLP

(57) ABSTRACT

In a mobile communication device, a method for compensating for a frequency adjustment in an oscillator shared between a communication circuit and a positioning signal receiver is provided. In one embodiment, a method for determining the operating frequency of an oscillator detects a beginning time point of a reference signal received by the mobile communication device and enables a counter to count in step with a clock signal derived from the oscillator. When an ending time point of the reference signal is received by the mobile communication device, the count is stopped, and the frequency of the oscillator is determined based on the count in the counter and an expected time that elapsed between the beginning time point and the ending time point.

12 Claims, 3 Drawing Sheets

COMPENSATION FOR FREQUENCY ADJUSTMENT IN MOBILE COMMUNICATION-POSITIONING DEVICE WITH SHARED OSCILLATOR

This application is a divisional of U.S. patent application Ser. No. 10/126,449 filed Apr. 19, 2002, now U.S. Pat. No. 6,724,342.

BACKGROUND OF THE INVENTION

1. Field of the Invention

The present invention relates to a mobile communication device with a positioning capability. In particular, the present invention relates to a mobile communication device (e.g., a cellular telephone) that is also capable of receiving a global positioning system (GPS) signal, and which shares an oscillator between the communication and positioning functions.

2. Description of the Related Art

The utility of a mobile communication device (e.g., a cellular telephone) is enhanced if it is provided the additional capability of receiving and processing global positioning system (GPS) signals that can be used to determine the position of the mobile communication device.

To provide for both positioning and communication functions, it is possible to share a local oscillator between the receiver and transmitter of the communication circuit and the GPS signal receiver. While sharing a local oscillator can reduce the cost and bulkiness of such a mobile communication device, there are some practical problems to be overcome to achieve high performance. For example, in cellular communications, when a mobile communication device leaves the service area of a base station and enters into the service area of another base station, a "hand-off" procedure takes place in which the mobile communication device tunes into the operating frequency or channel of the new base station. During the hand-off, it is often necessary to adjust the offset (i.e., deviation from the base station's "nominal center frequency"), as each base station may have a different offset. In degraded signal conditions, continuous tracking of a carrier may also require an offset frequency adjustment. However, if such an adjustment is made during the acquisition of a GPS signal, both the mixing frequency and the sampling frequency of the GPS receiver—used in down-converting and digitizing the GPS signal, respectively—are affected. The received signal may yield an erroneous result, or even a failure to detect the GPS signal. In fact, in one system, a 0.05 parts-per-million (ppm) adjustment has the effect of a 79 Hz shift in the carrier frequency in the received GPS signal.

One approach avoids the corruption of the GPS signal by locking the communication circuit out from accessing the oscillator for frequency adjustment so long as a GPS signal acquisition is in process. However, such an approach is undesirable because it prevents the mobile communication device from establishing contact with one or more base stations while a GPS signal is being acquired, which may lead to temporary loss of communication service. Also, such an approach complicates the control software in the mobile communication device, thereby deterring manufacturers from incorporating positioning capability in their mobile communication devices.

In GPS signal detection, one source of uncertainty in the carrier modulation frequency in the received signal is the "clock Doppler," which results from the unknown syntony between the clock on the signal source (e.g., a GPS satellite) and the receiver's own clock. Precise knowledge of the local oscillator's frequency can reduce the frequency search space ("Doppler range") for the GPS signal. At any given time, the actual frequency of a local oscillator depends on a number of variables, such as manufacturing variations, temperature, aging and operating voltage. Oscillators used in signal sources (e.g., GPS satellites) are typically well-characterized and are tuned to the specified frequency with high accuracy. Because of their cost, high power requirements, and bulkiness, however, such oscillators are unsuited for use in a mobile communication device. To more accurately determine the operating frequency of a local oscillator, the prior art typically requires a more costly oscillator then conventionally found in a mobile communication device. Others require a complex calibration procedure to tune the oscillator to a precision carrier frequency. The latter approach is disclosed, for example, in U.S. Pat. No. 5,874,914 to Krasner, entitled "GPS Receiver utilizing a Communication Link." Neither approach is satisfactory from a cost and performance standpoint.

SUMMARY

According to one embodiment of the present invention, provided in a mobile communication device, is a method for compensating for a frequency adjustment in an oscillator shared between a communication circuit and a positioning signal receiver. In one embodiment, the method includes (a) at a first point in time, beginning receiving and storing into a storage device the positioning signal; (b) at a second time point, adjusting a frequency of the oscillator by a given amount; (c) recording the frequency adjustment; (d) at a third time point, completing receiving and storing of the positioning signal from the positioning signal receiver; and (e) processing the positioning signal, taking into consideration the frequency adjustment. In one implementation, the second time point is recorded as the time at which the frequency adjustment of the oscillator is made. Having the knowledge of the time at which the frequency adjustment is made, the processing searches for a frequency shift in the received positioning signal between the second time and the third time. In another implementation, the amount by which the frequency of the oscillator is adjusted is recorded, and the processing searches for a time point at which the frequency adjustment of the oscillator is made. In one implementation, the processing integrates a correlation function.

The present invention is applicable to GPS processing using aiding data, such as satellite ephemeris data. The present invention is particularly applicable to cellular communication in which an oscillator adjustment may be made when the mobile receiver moves between service areas of base stations.

Thus, accurate processing of the positioning data is ascertained without preventing the communication circuit from accessing the shared oscillator while positioning data is being acquired.

According to another aspect of the present invention, a mobile communication device determines an operating frequency of an oscillator based on a reference signal from a reliable time base. In one embodiment, a beginning time point of the reference signal is received by the mobile communication device. When the beginning time point of the reference signal is detected, a counter is enabled to count a number of cycles in a clock signal derived from the oscillator. The ending time point of the reference signal is then detected. Upon detecting the ending time point of the reference signal, the counter is stopped to prevent the counter from further counting. Finally, the frequency of the oscillator is determined based on the count in the counter and an expected time that elapsed between the beginning time point and the ending time point.

The present invention can use reference signals having a known duration in time, or having recurring events in the reference signal that recurs at a fixed frequency. In some implementation, the frequency of the oscillator so derived can be further adjusted, taking into account the processing times in the mobile communication device for detecting the beginning time point and the ending time point.

Using the method of the present invention, the operating frequency of a local oscillator can be determined to the accuracy of the oscillator of the base station oscillator, without incurring the expense or inconvenient bulkiness of the more costly, higher precision oscillator typically found in base stations or less mobile equipment. In a GPS signal receiver, by removing the uncertainty in oscillator frequency, the Doppler range over which the positioning signal receiver software searches can be further limited.

The present invention is better understood upon consideration of the detailed description below and the accompanying drawings.

BRIEF DESCRIPTION OF THE DRAWINGS

To facilitate comparison between figures and to simplify the detailed description below, like reference numerals are used for like elements in the figures.

DETAILED DESCRIPTION OF THE PREFERRED EMBODIMENTS

The present invention provides a method that compensates the frequency adjustment effects in the positioning signal detection process. According to another aspect of the present invention, a method for accurately determining the frequency of a local oscillator is provided.

Figure 1:
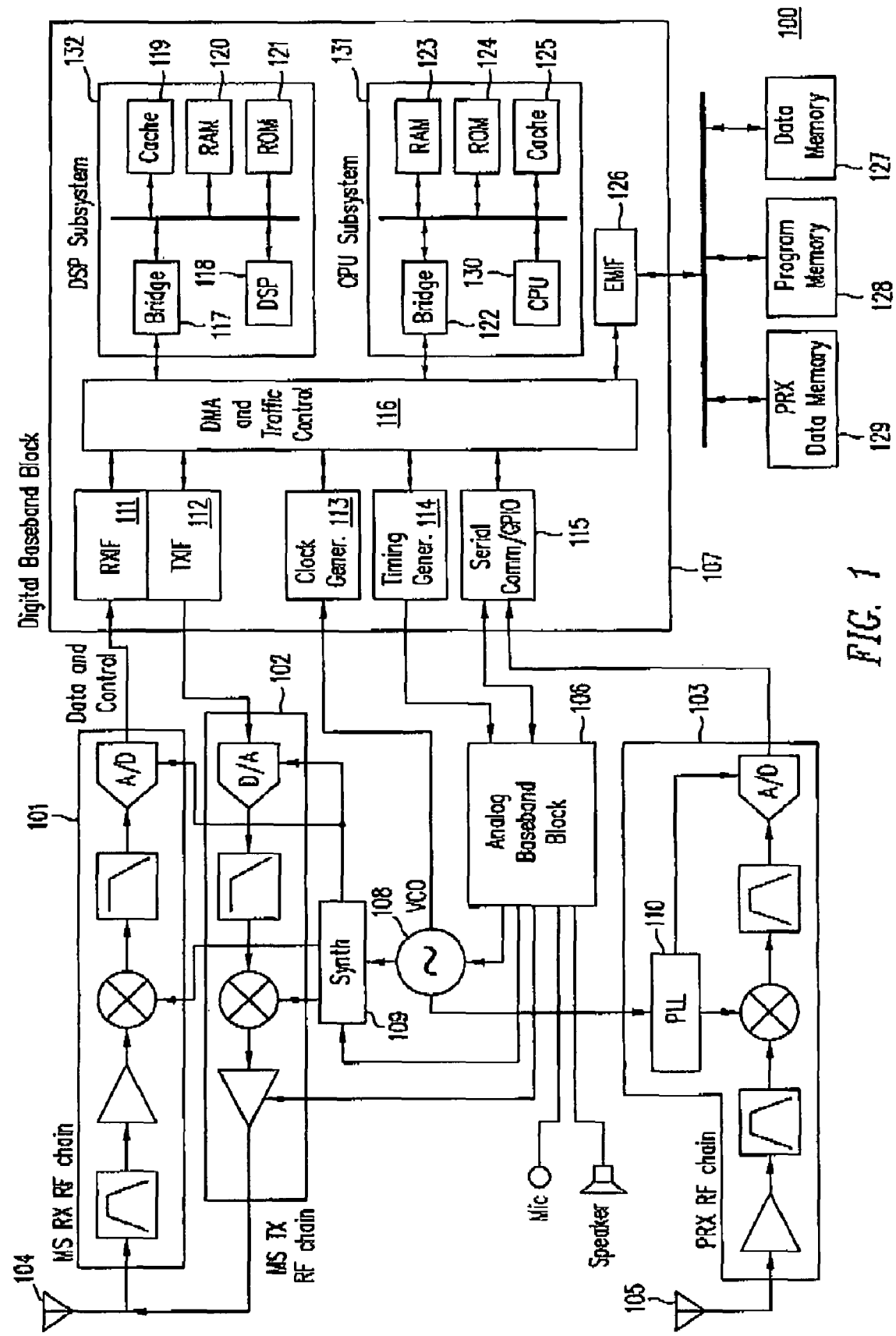
FIG. 1 shows a block diagram of mobile communication device 100 to which a method of the present invention is applicable.

FIG. 1 shows a block diagram of mobile communication device 100 to which a method of the present invention is applicable. Mobile communication device 100 can be, for example, a cellular telephone handset. As shown in FIG. 1, mobile communication device 100 includes communication receiver 101, communication transmitter 102, positioning signal receiver 103, analog baseband circuit 106, digital baseband circuit 107, shared local oscillator 108 and synthesizer 109. In mobile communication device 100, shared local oscillator 108 is the frequency source for communication receiver 101, communication transmitter 102, and positioning signal receiver 103. Shared local oscillator 108 can be implemented, for example, by a voltage-controlled oscillator. Antenna 104 serves both communication receiver 101 and communication receiver 102, and antenna 105 serves positioning signal receiver 103.

A communication signal coupled by antenna 104 into communication receiver 101 is band-pass filtered, amplified and then down-converted by mixing with a signal from synthesizer 109 to a baseband signal; (The signal from synthesizer 109 has the expected carrier modulation frequency.) The baseband signal so obtained is low-pass filtered and sampled for digital processing in digital baseband circuit 107. A communication signal to be transmitted is provided as a digital signal from digital baseband circuit 107. The digital signal is converted into analog form, filtered and modulated by mixing with a carrier frequency provided by synthesizer 109. The modulated signal is amplified and transmitted through antenna 104. The positioning signal received at positioning signal receiver 103 is processed in substantially the same manner as described for the communication signal, except that the expected modulation carrier frequency, rather than generated by a synthesizer (e.g., synthesizer 109), is provided by a PLL, which multiplies the frequency of shared local oscillator 108 by a factor of 100 or more.

Analog baseband circuit 106's functions include enabling communication transmitter 102 to transmit a communication signal, providing a frequency adjustment to shared local oscillator 108, and changing the frequency in synthesizer 109. As mobile communication device 100 switches between base stations, analog baseband circuit 106 directs synthesizer 109 to switch between the channels of the base stations. As explained above, switching between base stations or tracking a carrier signal during degraded signal conditions may necessitate a frequency adjustment to shared local oscillator 108. In addition, as shown in FIG. 1, analog baseband circuit 106 may include a codec and interfaces to a microphone and a speaker for processing voice communication. The codec quantizes a voice signal from the microphone into digital samples to be processed by digital baseband circuit 107 and reconstructs an analog audio or voice signal from digital samples provided by digital baseband circuit 107. The analog audio signal is replayed at the speaker.

Digital baseband circuit 107 includes receiver interface (RXIF) 111 and transmitter interface (TXIF) 112 to communication receiver 101 and communication transmitter 102, respectively. The output signal of shared local oscillator 108 provides a reference signal for clock generation circuit 113 to provide the internal clock signals distributed within digital baseband circuit 107 and analog baseband circuit 106 (e.g., to drive sampling of a voice codec). The internal clock signals generate from timing generation circuit 114 timing strobes used both internally in digital baseband circuit 107 and analog baseband circuit 106. Various serial communication and input/output (I/O) ports 115 are provided in digital baseband circuit 107 for communication with peripheral devices, positioning signal receiver 103 and analog baseband circuit 106.

Digital baseband circuit 107, which can be implemented as an application specific integrated circuit (ASIC), includes central processing unit (CPU) subsystem 131, which performs and controls the communication functions of mobile communication device 100. Such communication functions include executing the communication protocol stack, peripheral hardware control, man-machine interface (e.g., keypad and graphical user interfaces), and any application software. As shown in FIG. 1, in this embodiment, external memory modules 127, 128 and 129 are coupled to digital baseband circuit 107 through external memory interface (EMIF) 126.

External memory modules 127, 128 and 129 are used in this embodiment to provide data memory, program memory and positioning data memory for CPU subsystem 131. (Positioning data memory stores samples of a positioning signal and data used in positioning signal detection.) In other embodiments, data memory, program memory and positioning data memory can be provided by built-in memory modules in digital baseband circuit 107. Alternatively, positioning data memory 129 and data memory 128 can reside in the same physical memory module. As shown in FIG. 1, CPU subsystem 131 communicates with RXIF 111, TXIF 112, clock generation circuit 113, timing generation circuit 114 and communication and I/O ports 115 over a direct memory access (DMA) and traffic control circuit 116.

As shown in FIG. 1, CPU subsystem 131 includes CPU 130, random access memory (RAM) 123, read-only memory (ROM) 124 and cache memory 131. CPU 130 communicates with RAM 123, ROM 124 and cache memory 131 over a processor bus. Bridge 122 allows data to flow between the processor bus and DMA and traffic control circuit 116. As known to those skilled in the art, software executed by CPU 130 can be stored in a non-volatile fashion in ROM 124 and also in external program memory 128. RAM 123 and cache memory 131 provide the memory needs of CPU 130 during its operation.

In the embodiment shown in FIG. 1, digital signal processor (DSP) subsystem 132 is provided in digital baseband circuit 107. DSP subsystem 132 can be used to execute computationally intensive tasks, such as encoding and decoding voice samples, and executing the tasks of the physical layer in communication with a station. DSP subsystem 130 can be implemented, for example, substantially the same organization as CPU subsystem 131, and provided similar access to external memory modules 127, 128 and 129 through EMIF 126.

The positioning signal receiver software, which detects GPS signals from multiple GPS satellites to determine the location of mobile communication device 100, may be run on either CPU subsystem 131 or DSP subsystem 132. In this embodiment, the digitized samples of the received GPS signal are stored in memory. The stored GPS signal samples are then later retrieved and processed to search for the GPS satellite, the code phase and frequency shift ("Doppler") that would provide the received signal. In one embodiment, positioning receiver software searches for a peak in the modulus of a complex correlation integral under hypothesized code phase, Doppler and integration time values. One example of such positioning receiver software is disclosed in co-pending and commonly assigned patent application ("Copending Application"), U.S. application Ser. No. 10/126,853, entitled "Method for Optimal Search Scheduling in Satellite Acquisition" by J. Stone et al., filed on or about the same day as the present application, now U.S. Pat. No. 6,835,241. The disclosure of the Copending Application is hereby incorporated by reference in its entirety.

If the mobile communication device, in response to communication with a base station, adjusts the frequency of shared local oscillator 108 while the GPS signal is being captured, a discontinuity appears as a step shift in carrier frequency in the digitized GPS signal. The present invention compensates for this carrier frequency shift in the complex correlation integral.

Figure 2:
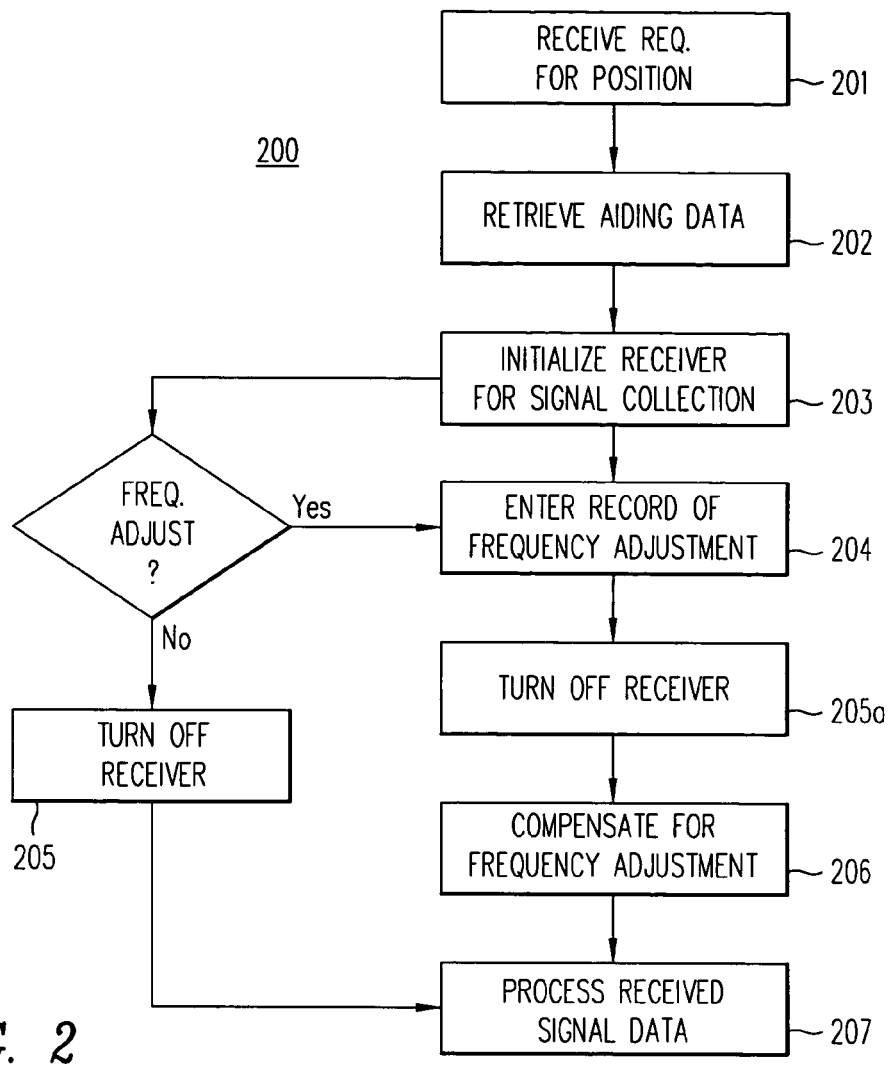
FIG. 2 shows a flow chart of method 200 that compensates for the frequency adjustment in shared local oscillator 108, in accordance with one embodiment of the present invention.

FIG. 2 shows a flow chart of a method that compensates for the frequency adjustment in shared local oscillator 108, in accordance with the present invention. As shown in FIG. 2, at step 201, the data processing portion of the positioning signal receiver software (PRXPF) receives a request for the user's position (e.g., the user selecting a "get position" command from a menu), or from an external source (e.g., a protocol request in a message relayed from the base station). At step 202, PRXPF retrieves aiding data (e.g., GPS ephemeris, approximate location, and time) from local storage or memory, or from an external source (e.g., by protocol messages to a server sent over a radio communication link to a base station). At step 203, the control portion of the positioning signal receiver software (PRXCF) initializes positioning signal receiver 103 to begin storing samples between time to $t_0$ time $t_2$. Time may be measured, for example, in mobile communication device 100's local time base or relative to a timing event in the communication link between mobile communication device 100 and a base station (e.g., a frame boundary in the radio communication interface to a base station). At time to, the contribution to the residual carrier frequency due to shared local oscillator 108 should ideally be zero.

Suppose at time $t_1$ ($t_0 < t_1 < t_2$), mobile communication device 100 adjusts the frequency of shared local oscillator 108 by an amount such that the residual carrier frequency in the positioning signal samples changes by $\Delta f_1$. Thus, at step 204, a record is made in mobile communication device 100, noting the time of the frequency adjustment and the amount of the frequency adjustment. At time $t_2$ (step 205), PRXCF turns off positioning signal receiver 103. At step 206, using the knowledge of the time and amount of the frequency adjustment, PRXPF performs the complex correlation integration using different hypotheses of a frequency offset due to shared local oscillator 108, according to whether the integration time limits are with the [$t_0$, $t_1$] interval or [$t_2$, $t_3$] interval. That is:

$$f_{vco}(t)=0, \text{ for } t_0<t<t_1$$

$$f_{vco}(t)=\Delta f_1, \text{ for } t_0<t<t_1$$

At step 207, using the compensated integration of step 206, PRXPF executes the remainder of PRXPF to obtain the pseudo-range and, consequently, the position of mobile communication device 100.

For any reason, if either the frequency adjustment time $t_1$ or the amount of frequency adjustment cannot be ascertained, the frequency adjustment time $t_1$ or the amount of frequency shift due to shared local oscillator 108 (i.e., $\Delta f_1$) are considered additional search parameters. For example, if the frequency adjustment time $t_1$ is known, but the frequency adjustment amount is not known, multiple hypothetical values for $\Delta f_1$ can be used to search for $\Delta f_1$. Alternatively, if the frequency adjustment time $t_1$ is not known, but the frequency shift due to shared local oscillator 108 is known, multiple hypothetical values for $t_1$ can be used to search for time $t_1$. Of course, if neither the frequency adjustment time $t_1$ nor the frequency shift due to shared local oscillator 108 is known, both the time and frequency parameter spaces have to be searched. In any case, the frequency adjustment software in the mobile communication device notifies the PRXPF that such an adjustment has occurred, and provides as much information related to the adjustment as is available.

Figure 3:
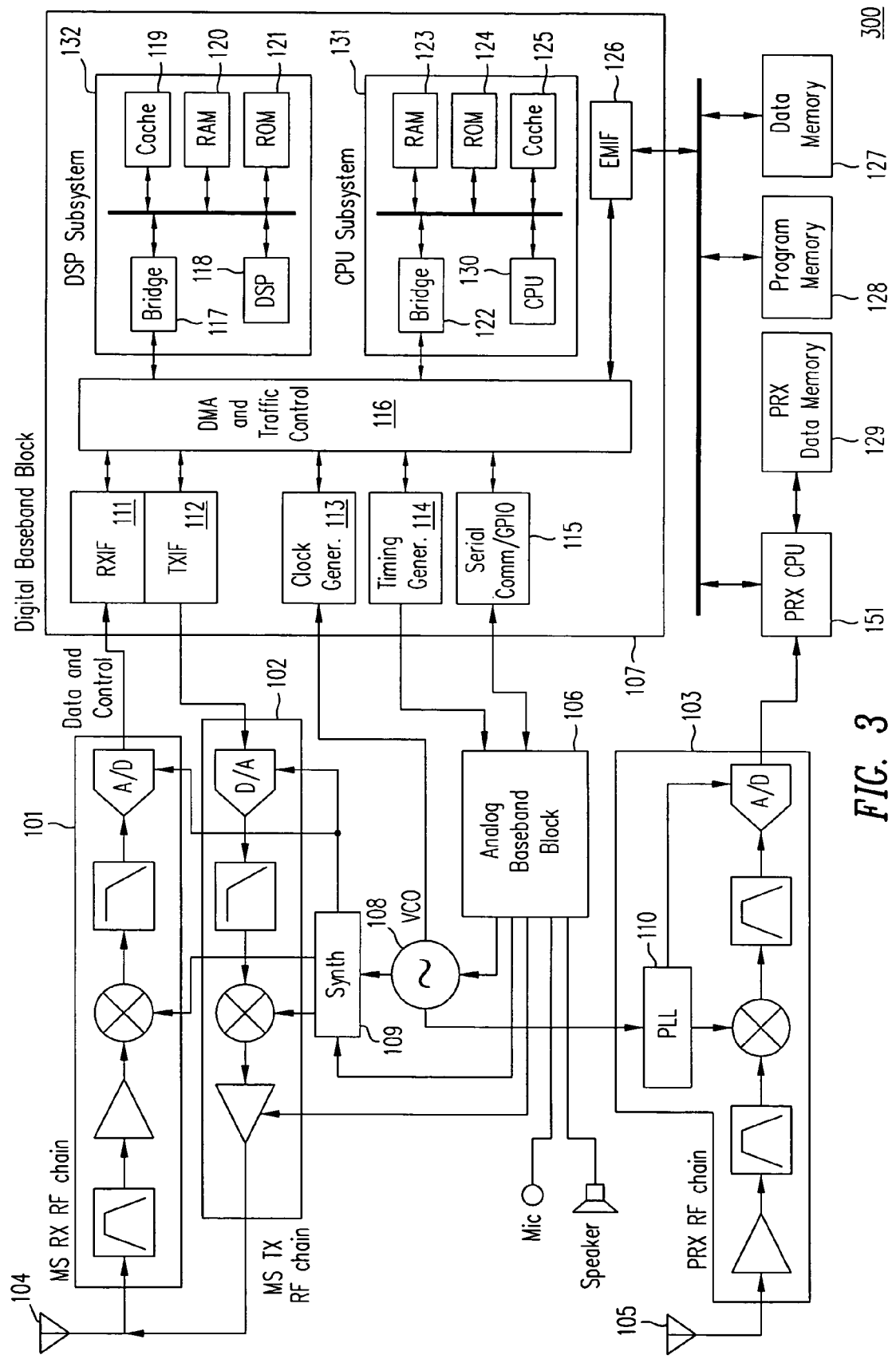
FIG. 3 shows a block diagram of mobile communication device 100 to which a method of the present invention is also applicable.

FIG. 3 shows a block diagram of mobile communication device 300, to which is a method of the present invention is also applicable. Unlike mobile communication device 100 of FIG. 1, mobile communication device 300 uses a CPU or DSP 151 which resides outside of digital baseband circuit 107. Other than where the positioning signal receiver software and data reside and execute, the operation of mobile communication device 300 and mobile communication device 100 with respect to location determination and compensation for frequency adjustment in shared local oscillator 108 are substantially identical.

According to another aspect of the present invention, the frequency of a local oscillator (e.g., shared local oscillator 108 or the higher frequency output signal of a phase-locked loop) can be determined using the oscillator of a base station. The present invention uses a timing signal of known duration, or having events of known recurring frequency, as a reference or "stop watch" signal to measure the actual local oscillator frequency. For example, in a CDMA network, a "short code" of 26 ⅔ millisecond duration is broadcast on a pilot channel. The frequency of the short code rollover at 37.5 Hz can be used for synchronization. Alternatively, a "long code" broadcast on a CDMA network can also be used to synchronize a 10 MHz source. Each code has a starting point and an ending point indicated by a predetermined pattern. Similarly, in. a GSM network, the Broadcast Control Channel (BCCH) transmitted by the base station includes a Synchronization Channel (SCH) having counts indicating the positions of the current frame within a multi-frame, super-frame and hyper-frame structures. The multi-frame, super-frame and hyper-fraxne structures have respective durations of 0.235 seconds, 6.12 seconds and approximately 3 hours and 29 minutes. Thus, in a GSM network, the starting points of successive multi-frames can be used as fixed time intervals. Other intervals inherent in the GSM air-interface frame structure can also be used as fixed time intervals. In addition, a counter is provided in the hardware that is clocked by a clock signal generated from shared local oscillator 108. In one embodiment, a nominally 200 MHz signal from a PLL in positioning signal receiver 103 is used to clock the counter.

Figure 4:
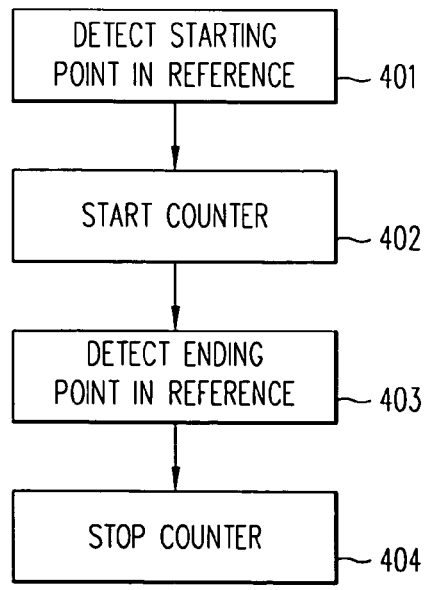
FIG. 4 illustrates method 400 for measuring the operating frequency of shared local oscillator 103, in accordance with one embodiment of the present invention.

FIG. 4 illustrates method 400 for measuring the operating frequency of shared local oscillator 108, in accordance with the present invention. As shown in FIG. 4, step 401 detects a starting point in the selected reference signal from the base station. At step 402, when the starting point in the reference signal is detected, the counter is reset to enable count, incrementing one for each cycle of its input clock signal. In one embodiment, detecting the starting point and starting the counter can be accomplished by software running in CPU subsystem 131. In other embodiments, these functions can be carried out in hardware. At step 403, when the ending point of the reference signal is detected, the counting is disabled. At that time, the count in the counter represents the number of clock cycles elapsed between the staffing and ending point of the referenced signal (i.e., the fixed time interval). The frequency of shared local oscillator 108 is thus simply the count in the counter divided by this fixed time interval. An adjustment to the count may be desirable to account for the latencies in signal detection and the counter operations for higher accuracy.

In one embodiment, shared local oscillator 108 can operate between 10-25 MHz. A PLL in positioning signal receiver 103 multiplies the oscillator frequency to 200 MHz. Theoretically, the uncertainty in this 200 MHz signal under method 400 in that embodiment is estimated to be 10 Hz. However, nondeterministic latencies (e.g., due to the tasks in CPU subsystem 130) brings the uncertainty up to about 100 Hz.

Using the method of the present invention, the operating frequency of shared local oscillator 108 can be determined to the accuracy of the oscillator of the base station oscillator, without incurring the expense or inconvenient bulkiness of the more costly higher precision oscillator typically found in base stations. By removing the uncertainty in oscillator frequency, the Doppler range over which the positioning signal receiver software searches can be further limited.

The above detailed description is provided to illustrate specific embodiments of the present invention and is not intended to be limiting. Numerous variations and modifications within the scope of the present invention are possible. For example, the detailed description above describes a system in which the positioning signal receiver stores the sampled received signal and later retrieves the stored data for processing. Another embodiment which processes the sampled data as they are sampled is within the scope of the present invention. The present invention is set forth in the following claims.

We claim:

1. In a communication device, a method for determining an operating frequency of an oscillator based on a reference signal from a reliable time base, comprising:
   detecting a beginning time point of the reference signal received by the communication device;
   upon detection of the beginning time point of the reference signal, enabling a counter to count in accordance with a clock signal derived from the oscillator;
   detecting an ending time point of the reference signal received by the communication device;
   upon detecting the ending time point of the reference signal, disabling the counter to stop the counter from further counting; and
   determining the frequency of the oscillator based on the count in the counter and an expected time that elapsed between the beginning time point and the ending time point.

2. A method as in claim 1, wherein the beginning time point and the ending time point represent a known duration in time.

3. A method as in claim 1, wherein the beginning time point and the ending time point represent arrivals of recurring events in the reference signal, the recurring events recurs at a fixed frequency.

4. A method as in claim 1, further comprising adjusting for processing times in the communication device for detecting the beginning time point and the ending time point.

5. A method as in claim 1, wherein the frequency of the oscillator thus determined is provided to a positioning signal receiver.

6. A method as in claim 5, wherein the positioning signal receiver receives global positioning system (GPS) signals.

7. An oscillator frequency determining apparatus in a communication device, comprising:
   an oscillator providing a periodic output signal;
   a receiver receiving a reference signal from a reliable time base;
   a detector detecting a beginning time point and an ending time point of the reference signal received by the communication device;
   a counter that begins counting the number of periods in the output signal of the oscillator in response to the detector detecting the beginning time point and stops counting in response to the detector detecting the ending time point of the reference signal; and
   an arithmetic unit for determining the frequency of the oscillator based on the count in the counter and an expected time that elapsed between the beginning time point and the ending time point.

8. An apparatus as in claim 7, wherein the beginning time point and the ending time point represent a known duration in time.

9. An apparatus as in claim 7, wherein the beginning time point and the ending time point represent arrivals of recurring events in the reference signal, the recurring events recurs at a fixed frequency.

10. An apparatus as in claim 7, wherein the arithmetic unit further adjusts for processing times in the communication device for detecting the beginning time point and the ending time point.

11. An apparatus as in claim 7, wherein the frequency of the oscillator thus determined is provided to a positioning signal receiver.

12. An apparatus as in claim 11, wherein the positioning signal receiver receives global positioning system (GPS) signals.

* * * * *